US011996348B2

(12) United States Patent
Schwarz

(10) Patent No.: US 11,996,348 B2
(45) Date of Patent: May 28, 2024

(54) SEMICONDUCTOR MODULE ASSEMBLY HAVING A COOLING BODY AND AT LEAST ONE SEMICONDUCTOR MODULE

(71) Applicant: Siemens Aktiengesellschaft, Munich (DE)

(72) Inventor: Florian Schwarz, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 18/284,751

(22) PCT Filed: Feb. 21, 2022

(86) PCT No.: PCT/EP2022/054223
§ 371 (c)(1),
(2) Date: Sep. 28, 2023

(87) PCT Pub. No.: WO2022/214231
PCT Pub. Date: Oct. 13, 2022

(65) Prior Publication Data
US 2024/0087984 A1 Mar. 14, 2024

(30) Foreign Application Priority Data
Apr. 8, 2021 (EP) .................................. 21167429

(51) Int. Cl.
*H01L 23/427* (2006.01)
(52) U.S. Cl.
CPC ................... *H01L 23/427* (2013.01)
(58) Field of Classification Search
CPC .................................................. H01L 23/427
See application file for complete search history.

(56) References Cited

U.S. PATENT DOCUMENTS 10,665,525 B2 5/2020 Teysseyre et al.
2002/0185726 A1 12/2002 North et al.
(Continued)

FOREIGN PATENT DOCUMENTS

DE 102010041714 A1 8/2011
DE 102013207804 B4 7/2018
(Continued)

OTHER PUBLICATIONS

PCT International Search Report and Written Opinion of International Searching Authority dated Jun. 27, 2022 corresponding to PCT International Application No. PCT/EP2022/054223 filed Feb. 21, 2022.

*Primary Examiner* — Peniel M Gumedzoe
(74) *Attorney, Agent, or Firm* — Henry M. Feiereisen LLC

(57) ABSTRACT

A semiconductor module assembly includes a cooling body having a cooling body main body and a cooling body attachment with a channel structure for a heat-transporting fluid. The channel structure is hermetically sealed with a cooling body main body surface so that the cooling body attachment and the cooling body main body are in direct contact with the heat-transporting fluid. The cooling body attachment includes a central piece having essentially parallel channels of the channel structure, and end pieces arranged on both sides of the central piece. Each end piece has deflection channels of the channel structure, which are arranged to establish a fluidic connection between the essentially parallel channels of the central piece. A semiconductor module contacts the cooling body, with the hermetically sealed channel structure of the cooling body attachment and the heat-transporting fluid forming a pulsating heat pipe which is thermally conductively connected to the semiconductor module.

19 Claims, 10 Drawing Sheets

(56) References Cited

U.S. PATENT DOCUMENTS

| | | | | |
|---|---|---|---|---|
| 2009/0141451 A1* | 6/2009 | Mori | .................... | H01L 23/473 |
| | | | | 361/699 |
| 2013/0285234 A1 | 10/2013 | Uhlemann et al. | | |
| 2014/0138075 A1* | 5/2014 | Yang | .................... | H01L 23/473 |
| | | | | 165/185 |
| 2021/0153394 A1 | 5/2021 | Mitic et al. | | |

FOREIGN PATENT DOCUMENTS

| | | |
|---|---|---|
| DE | 102018206020 A1 | 10/2019 |
| EP | 3336471 A1 | 6/2018 |
| JP | 2002289995 A | 10/2002 |

\* cited by examiner

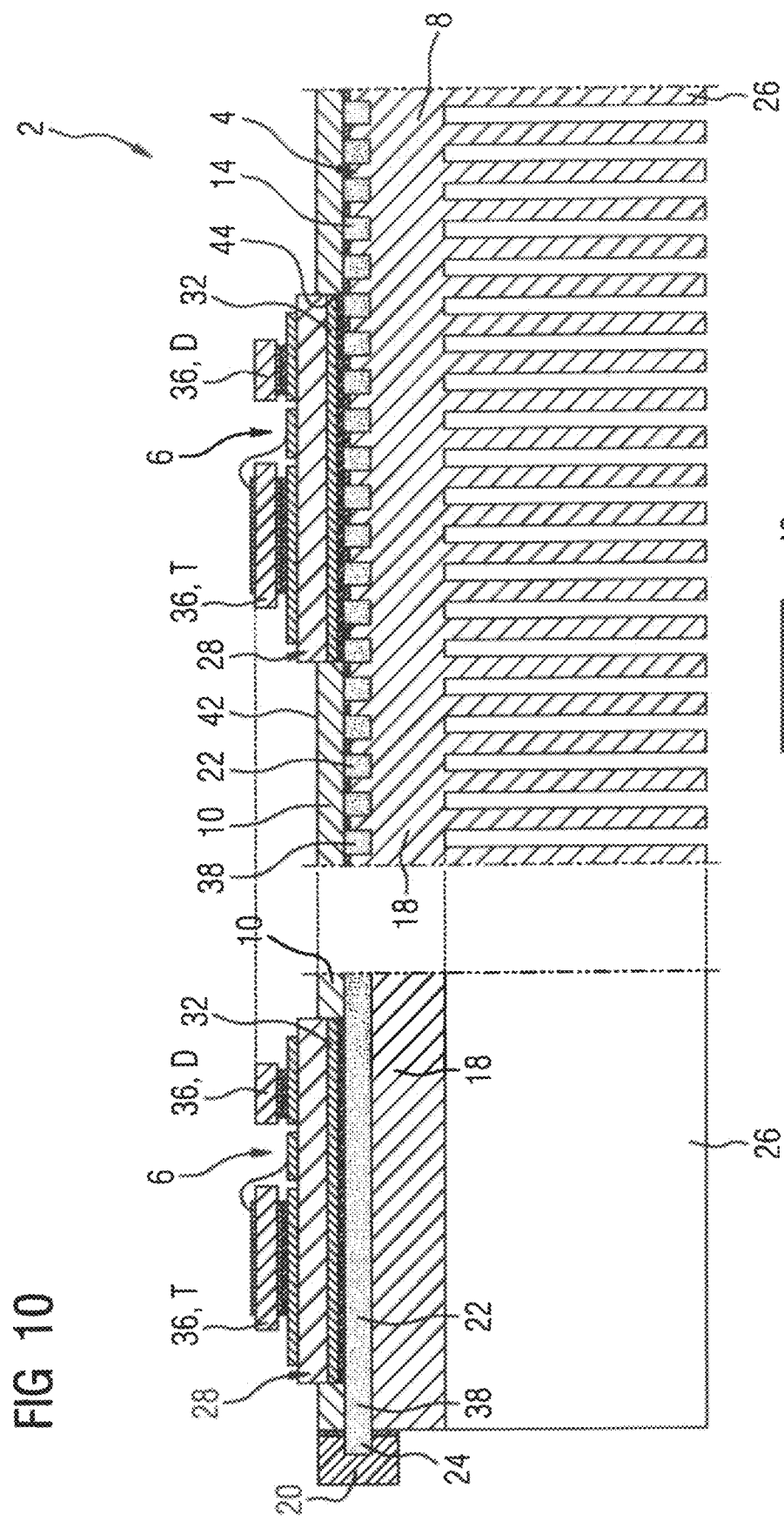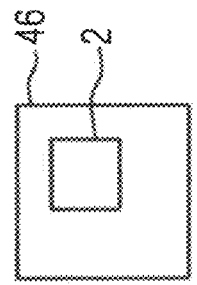

SEMICONDUCTOR MODULE ASSEMBLY HAVING A COOLING BODY AND AT LEAST ONE SEMICONDUCTOR MODULE

CROSS-REFERENCES TO RELATED APPLICATIONS

This application is the U.S. National Stage of International Application No. PCT/EP2022/054223, filed Feb. 21, 2022, which designated the United States and has been published as International Publication No. WO 2022/214231 A1 and which claims the priority of European Patent Application, Serial No. 21167429.6, filed Apr. 8, 2021, pursuant to 35 U.S.C. 119(a)-(d).

BACKGROUND OF THE INVENTION

The invention relates to a semiconductor module assembly having a cooling body and at least one semiconductor module.

The invention also relates to a power converter with at least one such semiconductor module assembly.

Such semiconductor module assemblies are usually used in a power converter. A power converter is understood to mean, for example, a rectifier, an inverter, a converter or a DC converter.

With progressive miniaturization in construction and connection technology, for example, through planar construction and connection technology, the power density in semiconductor modules is increasing. In order to avoid electronic failures due to thermal overloads, more effective but also more cost-effective concepts for heat dissipation from semiconductor elements are required.

Patent specification DE 10 2013 207 804 B4 describes a power module having a substrate having an electrically insulating element with a first metal-coated side and an opposite second metal-coated side and one or more semiconductor chips which are attached to the first metal-coated side of the substrate. A plurality of thermally conductive structures are laterally spaced apart and individually attached directly to the second metallized side of the substrate so that the plurality of thermally conductive structures protrude outwardly from the second metallized side.

Patent specification U.S. Pat. No. 10,665,525 B2 describes an apparatus with a module which includes a semiconductor chip. The apparatus may include a cooling body which is coupled to the module and includes a substrate and a plurality of protrusions. The apparatus may include a cover which includes a channel, the plurality of protrusions of the cooling body being arranged within the channel and may include a sealing mechanism which is arranged between the cover and the module.

Published unexamined patent application DE 10 2018 206 020 A1 describes an arrangement with a circuit board on which at least one electrical/electronic component is arranged, At least one heat pipe is formed in the circuit board.

Against this background, the object of the invention is to provide a semiconductor module assembly which, compared to the prior art, enables more effective heat dissipation and more cost-effective production.

SUMMARY OF THE INVENTION

This object is achieved according to the invention by a semiconductor module assembly having a cooling body and at least one semiconductor module which is contacted on the cooling body, wherein the cooling body comprises a cooling body main body and a cooling body attachment, wherein the cooling body attachment has, on a first surface, a channel structure in which a heat-transporting fluid is located, wherein the cooling body main body has a cooling body main body surface, wherein the channel structure is hermetically sealed by an integral connection with the cooling body main body surface of the cooling body main body so that both the cooling body attachment and the cooling body main body are in direct contact with the heat-transporting fluid, wherein the hermetically sealed channel structure and the heat-transporting fluid form a pulsating heat pipe which is thermally conductively connected to the semiconductor module.

Furthermore, the object is achieved according to the invention by a semiconductor module assembly having a cooling body and at least one semiconductor module which is contacted on the cooling body, wherein the cooling body comprises a cooling body main body and a cooling body attachment, wherein the cooling body main body has a cooling body main body surface, wherein on the cooling body main body surface a channel structure is formed in which a heat-transporting fluid is located, wherein the cooling body attachment has a first surface, wherein the channel structure is hermetically sealed by an integral connection with the first surface of the cooling body attachment so that both the cooling body attachment and the cooling body main body are in direct contact with the neat-transporting fluid, wherein the hermetically sealed channel structure and the heat-transporting fluid form a pulsating heat pipe which is thermally conductively connected to the semiconductor module.

Furthermore, the object is achieved according to the invention by a power converter with at least one such semiconductor module assembly.

The advantages and preferred embodiments described below with regard to the semiconductor module assembly can be transferred analogously to the power converter.

The invention is based on the consideration of cost-effective heat dissipation from at least one semiconductor module of a semiconductor module assembly via a cooling body with a pulsating heat pipe. A pulsating heat pipe (PHP), which is also referred to as an oscillating heat pipe (OHP), is an apparatus for heat transfer with a closed channel structure in which a heat transfer medium is arranged which alternately forms vapor segments and liquid segments along the channel structure due to the surface tension of the heat transfer medium. These vapor and liquid segments are stimulated to pulse or oscillate by a temperature gradient. At a heat source, the vapor segments expand due to the higher temperature; in addition, liquid heat transfer medium boils there and absorbs latent heat. At a heat sink, the vapor segments shrink due to condensation of gaseous heat transfer medium, thereby releasing latent heat. The local temperature and pressure differences drive the constant pulsation or oscillation of the vapor and liquid segments.

A cost-effective realization of one such pulsating heat pipe is achieved in that the cooling body comprises a cooling body main body and a cooling body attachment, the at least one semiconductor module being contacted on the cooling body. The semiconductor module can be contacted by welding, soldering, sintering or by mechanical pressing, for example by means of screws, and optionally sealed, for example, by means of a sealing ring. On a side of the cooling body attachment facing away from the at least one semiconductor module, a channel structure for receiving a heat-transporting fluid, which contains, for example, water, acetone or methanol, is inserted, the channel structure being hermetically sealed by an integral connection of the cooling body attachment to a cooling body main body surface of the cooling body main body, so that both the cooling body attachment and the cooling body main body are in direct contact with the heat-transporting fluid. The integral connection is produced, for example, by means of adhesive bonding, soldering, welding or sintering. In this context, there is direct contact when the heat-transporting fluid is in direct contact with both the cooling body attachment and the cooling body main body without any components arranged between them. By means of the hermetically sealed channel structure which contains the heat-transporting fluid, a pulsating heat pipe is formed, which is thermally conductively connected to the semiconductor module.

Alternatively, the channel structure for receiving the heat-transporting fluid is formed on the cooling body main body surface of the cooling body main body, the channel structure being hermetically sealed by an integral connection of the cooling body main body surface of the cooling body main body to the cooling body attachment so that both the cooling body attachment and the cooling body main body are in direct contact with the heat-transporting fluid.

Such a semiconductor module assembly enables the use of a standard cooling body, for example, an extruded standard cooling body, as the cooling body main body, so that a good cost position is achieved. The cooling body attachment can be produced cost-effectively, for example, by means of pressure die-casting. No pulsating heat pipe is required as a dedicated additional component. The filling of the pulsating heat pipe with the heat-transporting fluid can be carried out according to a standard process. Furthermore, effective heat dissipation is achieved by the pulsating heat pipe, so that, for example, no copper base plate is required for the at least one semiconductor module.

The cooling body attachment has a central piece and end pieces arranged on both sides, wherein the central piece comprises channels of the channel structure arranged essentially parallel, and wherein the end pieces arranged on both sides each have deflection channels of the channel structure, wherein the deflection channels are arranged in such a way that that they establish a fluidic connection between the channels of the central piece arranged essentially parallel. The deflection channels are designed, for example, as grooves. In particular, the end pieces are each integrally connected to the central piece. For example, the integral connection between the respective corner piece and the central piece is hermetically sealed in order to prevent the heat-transporting fluid from escaping. The central piece and the end pieces of the cooling body attachment are produced, for example, from a metallic material, in particular from aluminum or an aluminum alloy. Due to the parallel channels of the channel structure, the central piece can be produced easily and cost-effectively, for example by means of extrusion.

Another embodiment provides that the cooling body main body has a plurality of cooling fins on a side facing away from the coding body attachment, the channels of the central piece, which are essentially arranged parallel, running transversely to the cooling fins. Improved temperature distribution is achieved by such an orthogonal arrangement, so that more effective heat dissipation takes place.

Another embodiment provides that the at least one semiconductor module comprises a substrate comprising at least one semiconductor element and metallization arranged on a side facing away from the semiconductor element, the metallization of the substrate being directly connected to the cooling body attachment. In particular, the metallization of the substrate and at least part of the cooling body attachment may be formed in one piece. In this context, a direct connection is understood to mean a direct connection which includes connecting means for producing the integral connection such as, for example, adhesive, solder or sintering paste, but excludes an additional connecting element such as, for example, a spacer or a base plate. By eliminating such an additional connecting element, an improved thermal connection of the semiconductor module is achieved, so that improved heat dissipation takes place.

Another embodiment provides that the cooling body attachment has a cavity on a second surface, in which the semiconductor module is contacted with the cooling body attachment. The cavity, which has a rectangular outer contour, for example, is inserted in particular by machining, for example, milling, Due to the cavity, the semiconductor module can be arranged closer to the pulsating heat pipe, which leads to improved heat dissipation.

Another embodiment provides for the cavity to be configured in such a way that the semiconductor module is in direct contact with the heat-transporting fluid. In this context, there is direct contact if the heat-transporting fluid is in direct contact with parts of the semiconductor module without components arranged in between. For example, a depth of the cavity is selected to be at least large enough that the depth of the cavity and a second depth of the channels add up to a total thickness of the cooling body attachment. Such direct contact reduces the thermal contact resistances.

Another embodiment provides that at least the central piece of the cooling body attachment is produced from aluminum or an aluminum alloy, in particular by means of extrusion. An extruded cooling body attachment is, for example, made of an aluminum alloy with a lower silicon content, for example 0.5%, compared to a cast cooling body attachment, so that improved thermal conductivity is achieved. Such a cooling body attachment produced from aluminum or an aluminum alloy improves the thermal connection of the semiconductor module, in particular compared to a cooling body attachment made of plastic.

Another embodiment provides that the cooling body attachment is made of a dielectric material which is coated, in particular completely, with a metallic material, the semiconductor module being connected to the cooling body attachment by means of soldering. A dialectic material is, for example, a ceramic material or a plastic. The plastic cooling body attachment can be produced easily and cost-effectively, for example, by means of casting. Coating, in particular complete coating, with a metallic material, for example, copper, can be carried out cost-effectively and reliably by means of electroplating, thermal spraying methods or, in particular chemical or physical vapor disposition. For example, the metallic coating achieves improved gas tightness.

Another embodiment provides that the cooling body attachment is made of a dielectric material, the semiconductor module being connected to the cooling body attachment by means of adhesive bonding. In particular, the cooling body attachment acts as an insulator. A dielectric material is, for example, a ceramic material or a plastic. A cooling body attachment made of a plastic can be produced easily and cost-effectively, for example, by means of casting, in particular injection molding. A cooling body attachment produced of a ceramic material has almost optimal insulation properties and god thermal conductivity.

Another embodiment provides that the at least one semiconductor element of the semiconductor module is directly contacted on a metalization, wherein the dielectric material is designed to be electrically insulating, wherein the metallization of the semiconductor module is adhesively bonded directly to the cooling body attachment made of a dielectric material. A dielectric material layer of the substrate is thus omitted, so that thermal contact resistances are reduced by such direct contact.

BRIEF DESCRIPTION OF THE DRAWING

The invention is described and explained in more detail hereinafter with reference to the exemplary embodiments shown in the figures, in which:

FIG. 10 shows a diagrammatic view of an eighth embodiment of a semiconductor module assembly in cross-section and FIG. 11 shows a diagrammatic view of a power converter.

DETAILED DESCRIPTION OF PREFERRED EMBODIMENTS

Figure 1:
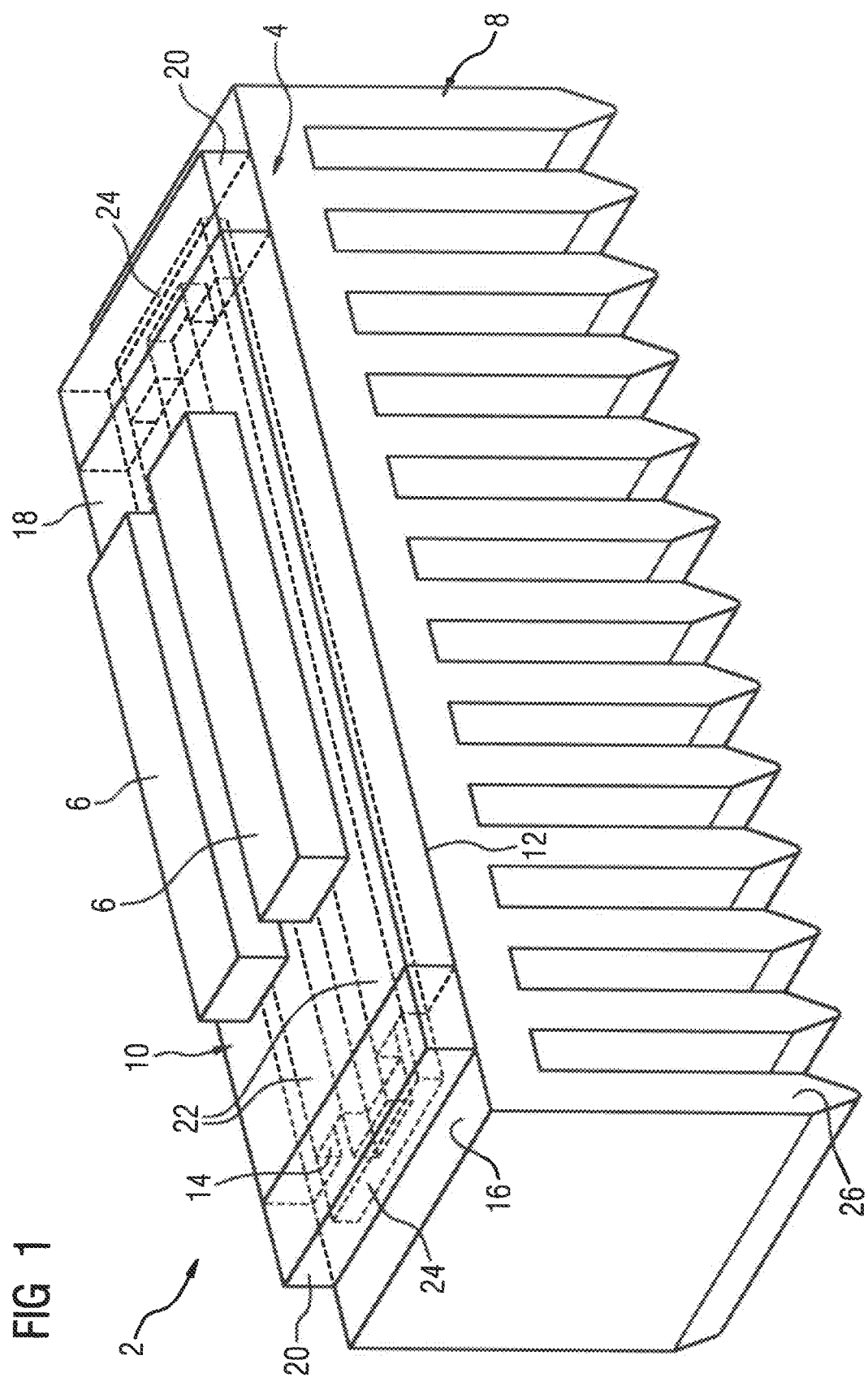
FIG. 1 shows a diagrammatic three-dimensional view of a first embodiment of a semiconductor module assembly.

The exemplary embodiments explained hereinafter are preferred embodiments of the invention. In the exemplary embodiments, the described components of the embodiments each represent individual features of the invention to be considered independently of one another, which also develop the invention independently of one another and are therefore also to be regarded as part of the invention individually or in a combination other than that shown as part of the invention. Furthermore, the described embodiments can also be supplemented by further features of the invention which have already been described.

Identical reference characters have the same meaning in the various figures.

FIG. 1 shows a diagrammatic three-dimensional view of a first embodiment of a semiconductor module assembly 2. The semiconductor module assembly 2 has a cooling body 4 and, by way of example, two semiconductor modules 6, which are contacted on the cooling body 4. The cooling body 4 has a cooling body main body 8 and a cooling body attachment 10, wherein the cooling body attachment 10 has, on a first surface 12, a channel structure 14 in which a heat-transporting fluid, for example, water, acetone or methanol, is located. The cooling body main body 8 is produced, for example, from aluminum or an aluminum alloy by means of extrusion and has a cooling body main body surface 16. The cooling body attachment 10 is integrally connected to the cooling body main body surface 16 of the cooling body main body 8. The integral connection is produced, for example, by means of adhesive bonding, soldering, welding or sintering. The channel structure 14 is hermetically sealed by the integral connection, both the cooling body attachment 10 and the cooling body main body 8 being in direct contact with the heat-transporting fluid. The hermetically sealed channel structure 14 and the heat-transporting fluid form a pulsating heat pipe which is thermally conductively connected to the semiconductor modules 6.

The cooling body attachment 10 has a central piece 18 and two end pieces 20 arranged on both sides, which are integrally connected to the central piece 18. The integral connection between the respective corner piece 20 and the central piece 18 is hermetically sealed in order to prevent escape of the heat-transporting fluid. The central piece 18 and the end pieces 20 of the cooling body attachment 10 are produced, for example, from a metallic material, in particular from aluminum or an aluminum alloy. The central piece 18 comprises essentially parallel channels 22 of the channel structure 14, so that the central part can be produced by means of extrusion. The end pieces arranged on both sides 20 comprise deflection channels 24 of the channel structure 14, the deflection channels 24 connecting the channels 22 of the central piece 18 arranged essentially in parallel and thus establishing a fluidic connection between the channels 22 arranged essentially in parallel. The deflection channels 24 are designed, for example, as grooves in the end pieces 20.

The cooling body main body 8 has a plurality of cooling fins 26 on a side facing away from the cooling body attachment 10, the essentially parallel channels 22 of the central piece 18 being arranged running transversely to the cooling fins 26.

Figure 2:
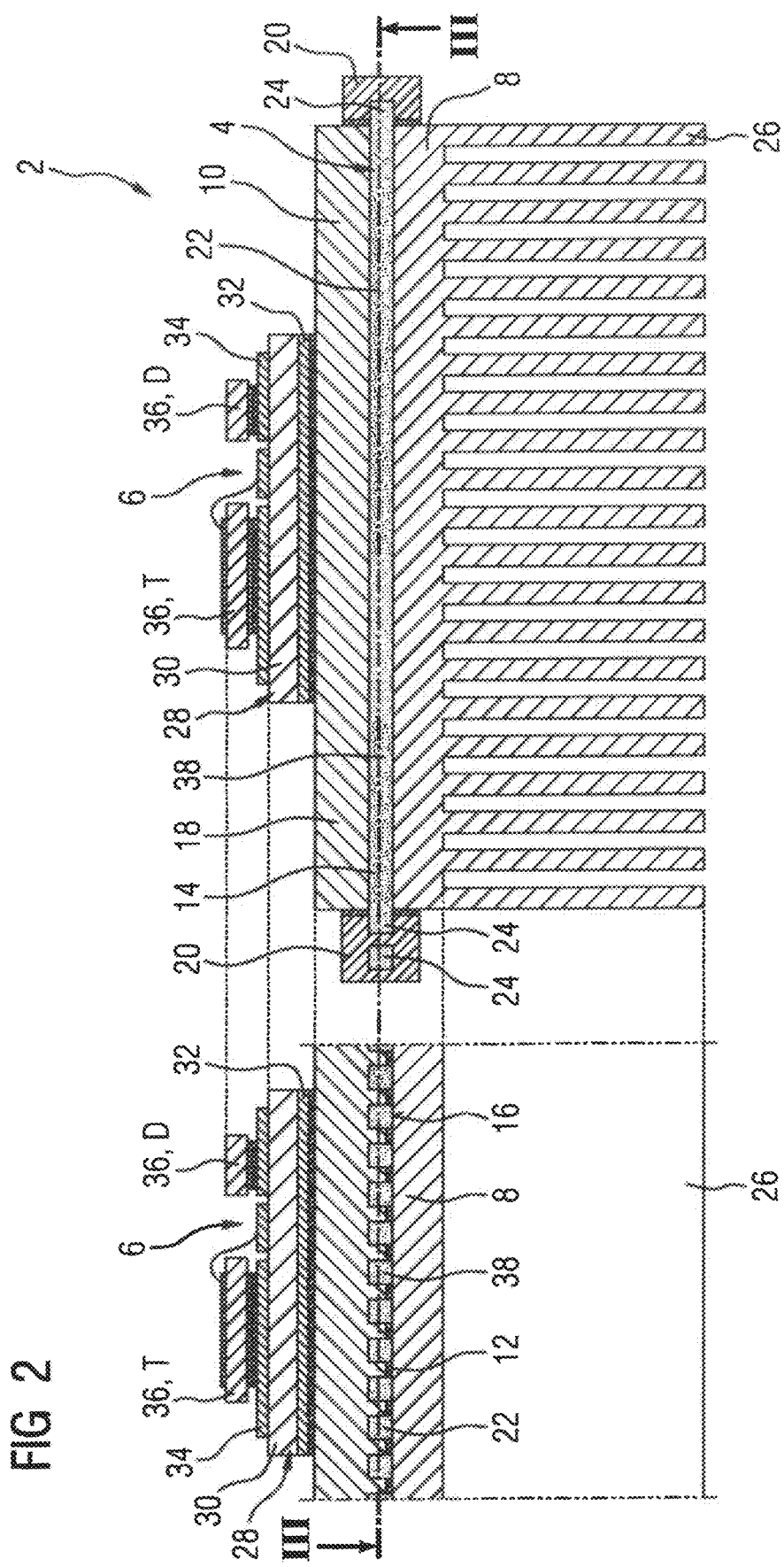
FIG. 2 shows a diagrammatic view of a second embodiment of a semiconductor module assembly in cross-section.

FIG. 2 shows a diagrammatic view of a second embodiment of a semiconductor module assembly 2 in cross-section, a semiconductor module 6 comprising a substrate 28 by way of example. The substrate 28 has a dielectric material layer 30 with a thickness of 25 µm to 400 µm, in particular 50 µm to 250 µm, which contains a ceramic material, for example aluminum nitride or aluminum oxide, or an organic material, for example a polyamide. Furthermore, the substrate 28 has a metallization 32 which is arranged on a side facing away from semiconductor elements 36 and contains, for example, copper. In particular, the metallization 32 of the substrate 28 and at least part of the cooling body attachment 10, for example, the central piece 18, can be formed in one piece. The semiconductor elements 36 are contacted on a copper cladding 34 of the substrate 28. The semiconductor elements 36 comprise, by way of example, a transistor T, which is designed in particular as an Insulated Gate Bipolar transistor (IGBT), and a diode D connected antiparallel to the transistor T. The transistor T can alternatively be designed as a Metal-Oxide Semiconductor Field-Effect transistor (MOSFET) or as a bipolar transistor. Additionally or alternatively, the semiconductor elements 36 comprise a digital logic module, in particular a Field Programmable Gate Array (FPGA), or another semiconductor. In particular, the transistor T has an area of at least 10 mm$^2$. The substrate 28 is directly integrally connected to the cooling body attachment 10 via the metallization 32. A direct integral connection is understood to mean a direct connection which includes connecting means for producing the integral connection such as adhesive, solder, sintering paste, etc., but excludes an additional connecting element such as an additional conductor, a bonding wire, a spacer, a base plate, etc.

The hermetically sealed channel structure 14 and the heat-transporting fluid 38 form a pulsating heat pipe which is thermally conductively connected to the semiconductor module 6. The essentially parallel channels 22 of the hermetically sealed channel structure 14 have an, in particular identical, rectangular or trapezoidal cross section. The further embodiment of the semiconductor module assembly 2 in FIG. 2 corresponds to that in FIG. 1.

Figure 3:
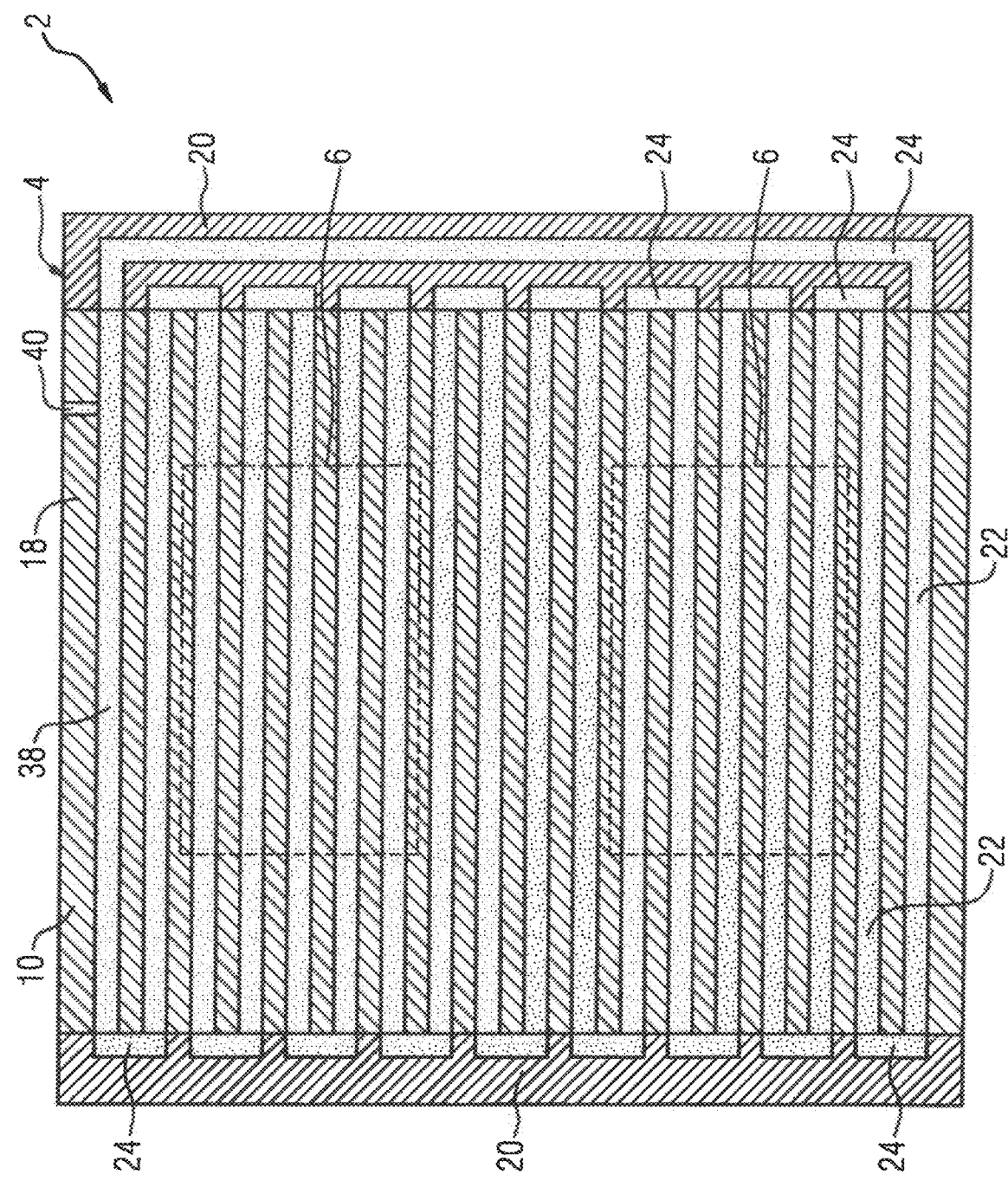
FIG. 3 shows a diagrammatic view of the third embodiment of the semiconductor module assembly in longitudinal section.

FIG. 3 shows a diagrammatic view of the third embodiment of the semiconductor module assembly 2 in longitudinal section. The channel structure 14 has a meander-shaped part, the meander shape being formed by the essentially parallel channels 22 and the deflection channels 24 connecting them. A closable opening 40 is provided for supplying the heat-transporting fluid 38. The further embodiment of the semiconductor module assembly 2 in FIG. 3 corresponds to that in FIG. 2.

Figure 4:
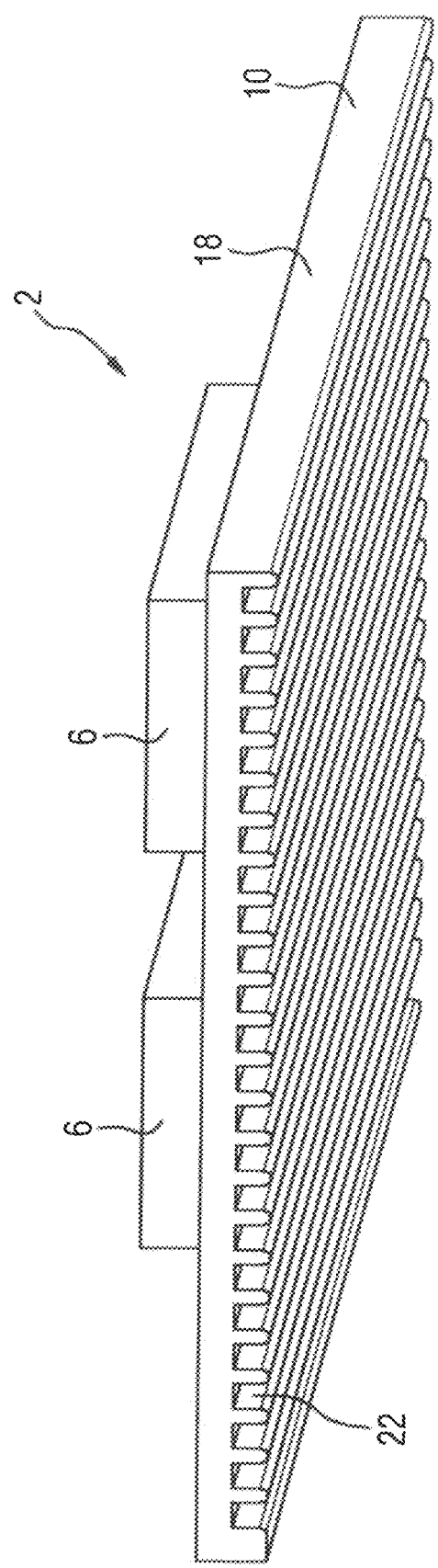
FIG. 4 shows a diagrammatic three-dimensional view of a section of the first embodiment of the semiconductor module assembly.

FIG. 4 shows a diagrammatic three-dimensional view of a section of the first embodiment of the semiconductor module assembly 2, wherein the central piece 18 of the cooling body attachment 10 is shown, on which, by way of example, the two semiconductor modules 6 are contacted. Furthermore, the essentially parallel channels 22 of the cooling body attachment 10 can be seen, which have an, in particular identical, rectangular cross section. The further embodiment of the semiconductor module assembly 2 in FIG. 4 corresponds to that in FIG. 1.

Figure 5:
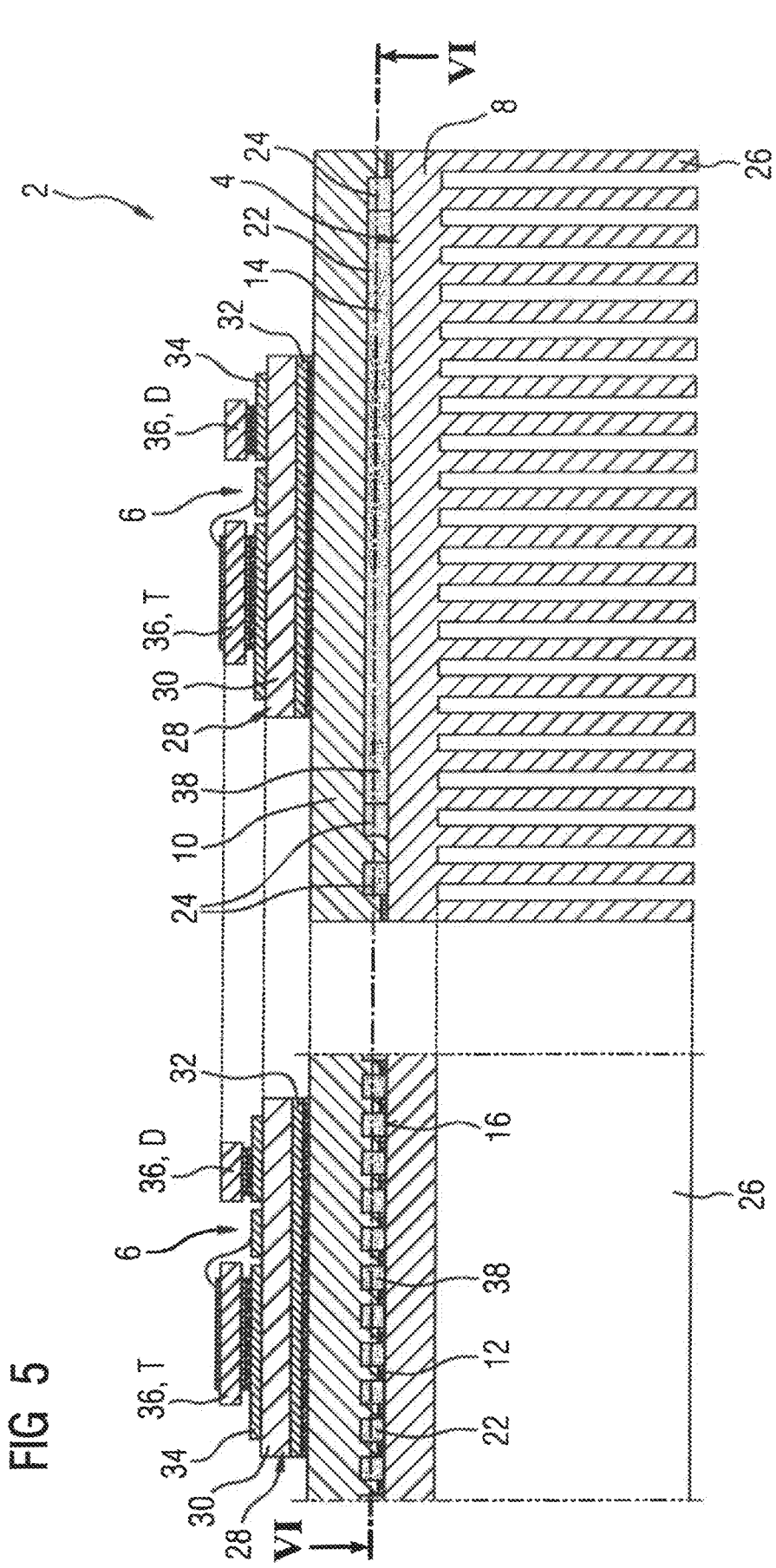
FIG. 5 shows a diagrammatic view of a fourth embodiment of a semiconductor module assembly in cross-section.

FIG. 5 shows a diagrammatic view of a fourth embodiment of a semiconductor module assembly 2 in cross-section, the cooling body attachment 10 being formed in one piece. The integrally formed cooling body attachment 10 is produced, for example, from aluminum or an aluminum alloy, in particular by means of a casting method, and is integrally connected to the cooling body main body 8, the channel structure 14 being hermetically sealed by the integral connection. The integral connection is produced, for example, by means of soldering, welding or sintering.

Alternatively, the integrally formed cooling body attachment 10 is made of a dielectric material, in particular by means of a casting method, and is integrally connected to the cooling body main body 8 by adhesion, the channel structure 14 being hermetically sealed by the adhesive bond. A dielectric material is, for example, a ceramic material such as aluminum oxide or a plastic, in particular a thermally conductive plastic. In this case, the semiconductor module 6 is adhesively bonded to the cooling body attachment 10, in particular with a thermally conductive adhesive. Optionally, the one-piece cooling body attachment 10 made of a dielectric material is coated, in particular completely, with a metallic material and connected to the cooling body main body 8, for example by means of soldering. In this case, the semiconductor module 6 can likewise be adhesively bonded, sintered or soldered to the cooling body attachment 10. The further embodiment of the semiconductor module assembly 2 in FIG. 5 corresponds to that in FIG. 2.

Figure 6:
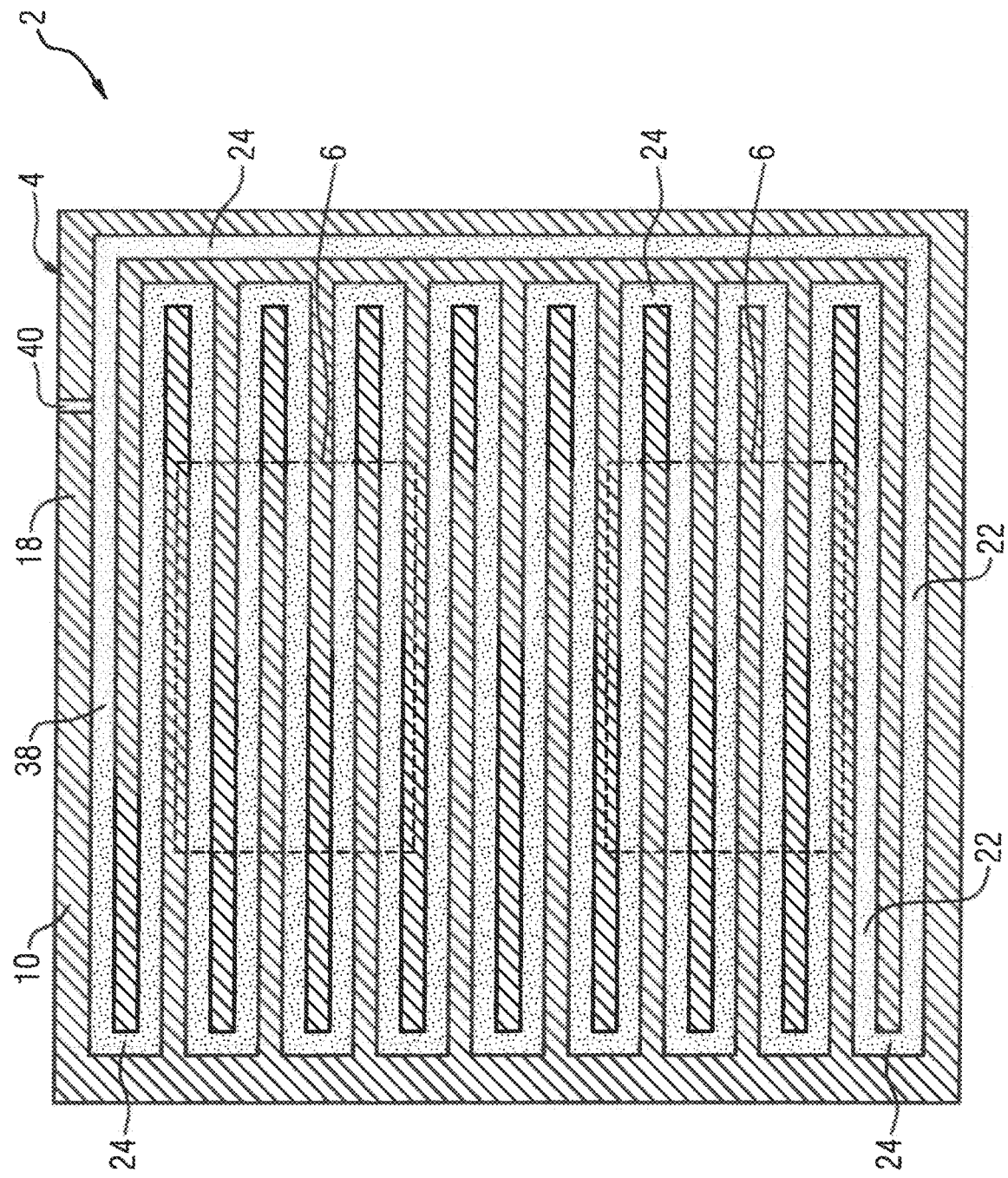
FIG. 6 shows a diagrammatic view of the fourth embodiment of the semiconductor module assembly in longitudinal section.

FIG. 6 shows a diagrammatic view of the fourth embodiment of the semiconductor module assembly 2 in longitudinal section. The channel structure 14 of the integrally formed cooling body attachment 10 has a meander-shaped part, the meander shape being formed by the essentially parallel channels 22 and the deflection channels 24 connecting them. A closable opening 40 is provided for supplying the heat-transporting fluid 38. The further embodiment of the semiconductor module assembly 2 in FIG. 6 corresponds to that in FIG. 5.

Figure 7:
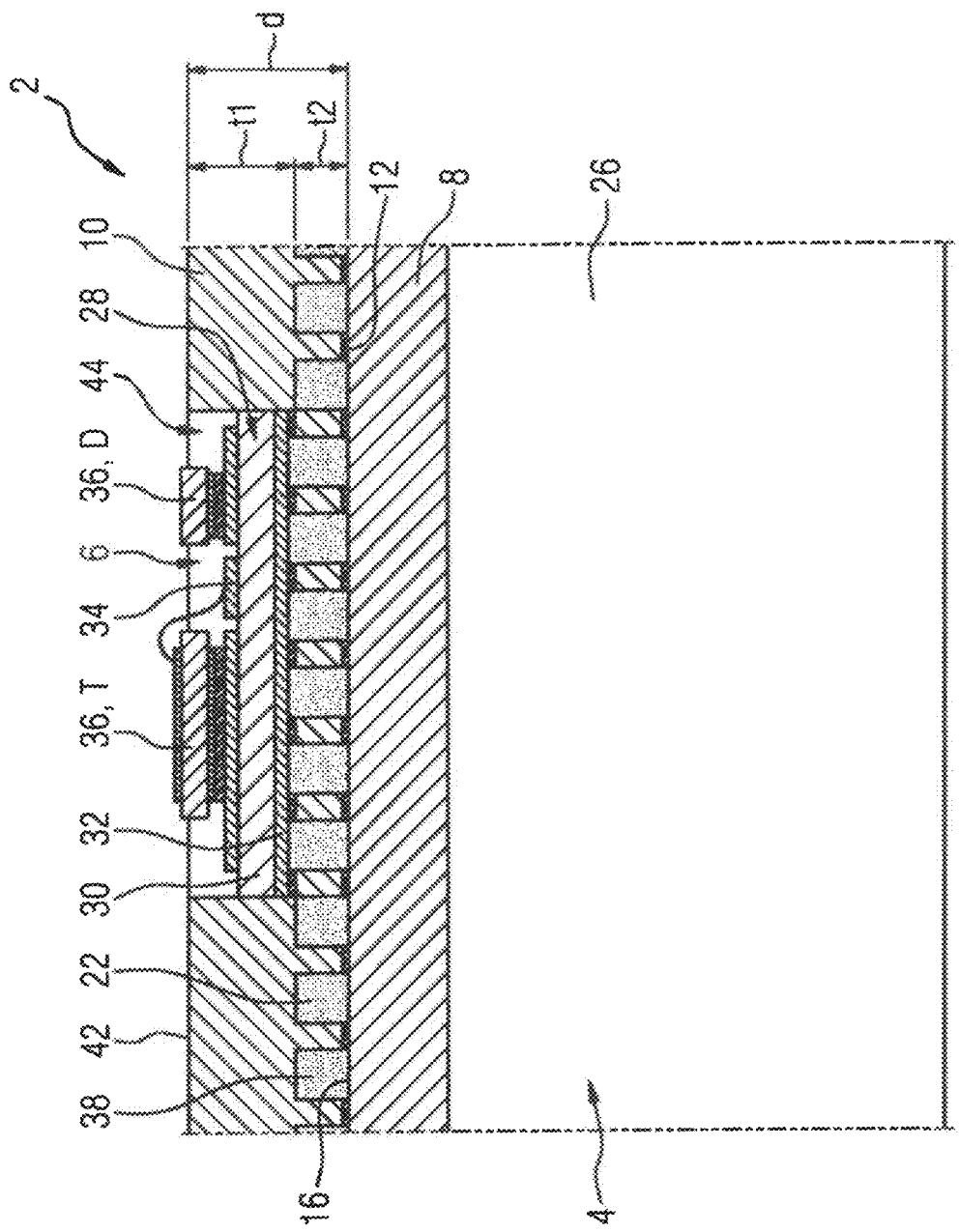
FIG. 7 shows a diagrammatic view of a section of a fifth embodiment of a semiconductor module assembly in cross-section.

FIG. 7 shows a diagrammatic view of a section of a fifth embodiment of a semiconductor module assembly in cross-section, the cooling body attachment 10 having a cavity 44 on a second surface 42 in which the semiconductor module 6 is contacted with the cooling body attachment 10. A first depth t1 of the cavity 44, which has, for example, a rectangular outer contour, is dimensioned in such a way that the metallization 32 of the semiconductor module 6 is in direct contact with the heat-transporting fluid 38. Direct contact exists in this context when the heat-transporting fluid 38 is directly contacted with parts of the metallization 32 of the semiconductor module 6 and without components arranged between them. In particular, the first depth t1 of the cavity 44 and a second depth t2 of the channels 22 add up to a thickness d of the cooling body attachment 10. The cavity 44 is produced, for example, by milling. The semiconductor module 6 is integrally connected to the cooling body attachment 10, in particular by means of adhesive bonding or soldering.

Figure 8:
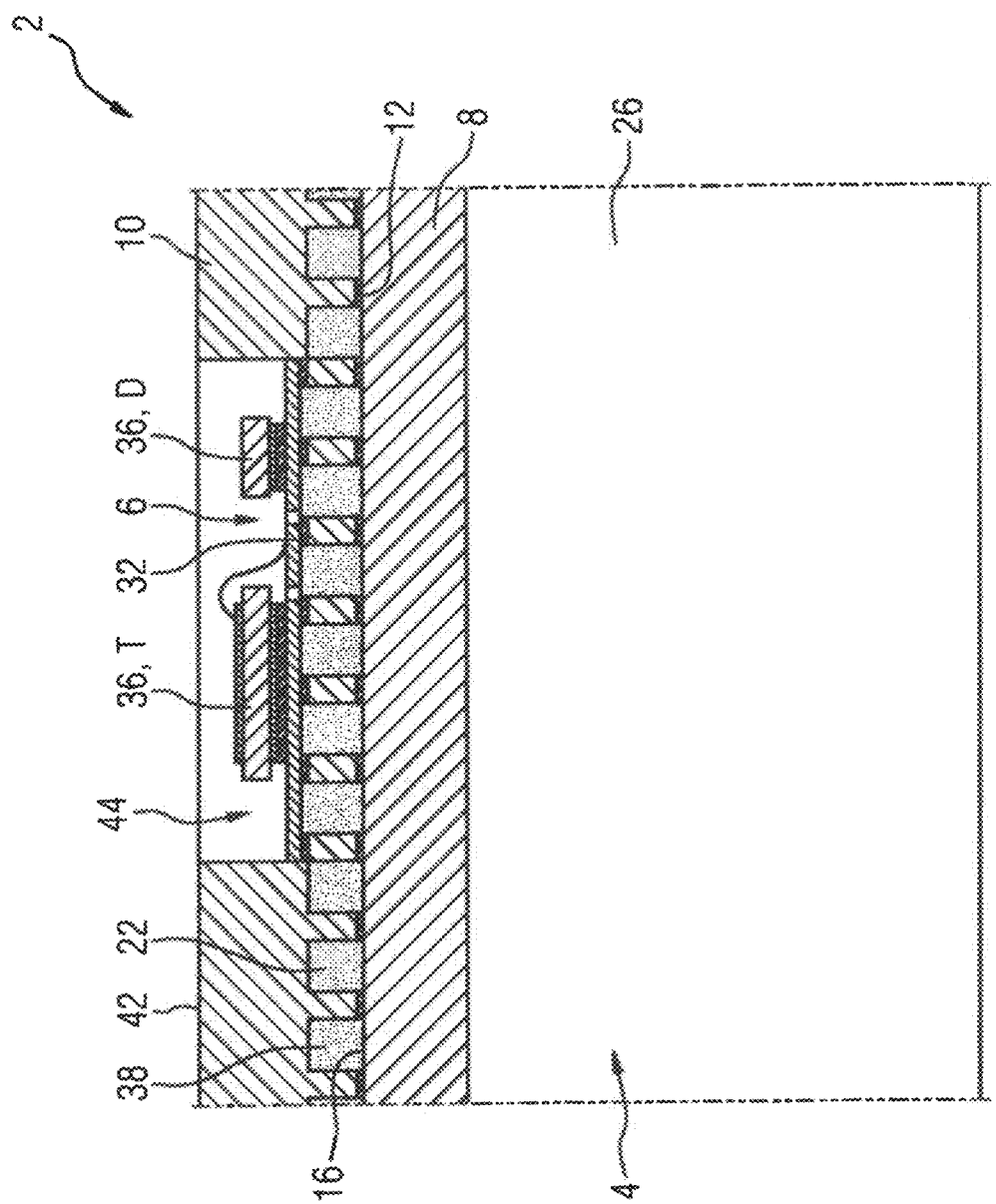
FIG. 8 shows a diagrammatic view of a section of a sixth embodiment of a semiconductor module assembly in cross-section.

Due to the pulsating heat pipe, good thermal conductivity of the material surrounding the channel structure 14 is only required for heat input and heat output. Heat input takes place via the metallization 32 of the semiconductor module 6 and the heat is emitted to the cooling body main body surface 16 of the cooling body main body 8. As the flow within the pulsating heat pipe can be adiabatic, the cooling body attachment 10 can be made of a plastic with low thermal conductivity. The further embodiment of the semiconductor module assembly 2 in FIG. 7 corresponds to that in FIG. 2 or FIG. 5, FIG. 8 shows a diagrammatic view of a section of a sixth embodiment of a semiconductor module assembly 2 in cross-section, the cooling body attachment 10 being made of a plastic. The semiconductor module 6 comprises semiconductor elements 36 which are directly contacted on a metallization 32. Direct contacting in this context is understood to mean direct contacting which includes connecting means such as adhesive, solder, sintering paste, etc, for producing the contact, but excludes an additional connecting element such as an additional conductor, a spacer, a base plate, etc. The metallization 32 of the semiconductor module 6 is adhesively bonded directly to the cooling body attachment 10 made from plastic. The further embodiment of the semiconductor module assembly 2 in FIG. 8 corresponds to that in FIG. 7.

Figure 9:
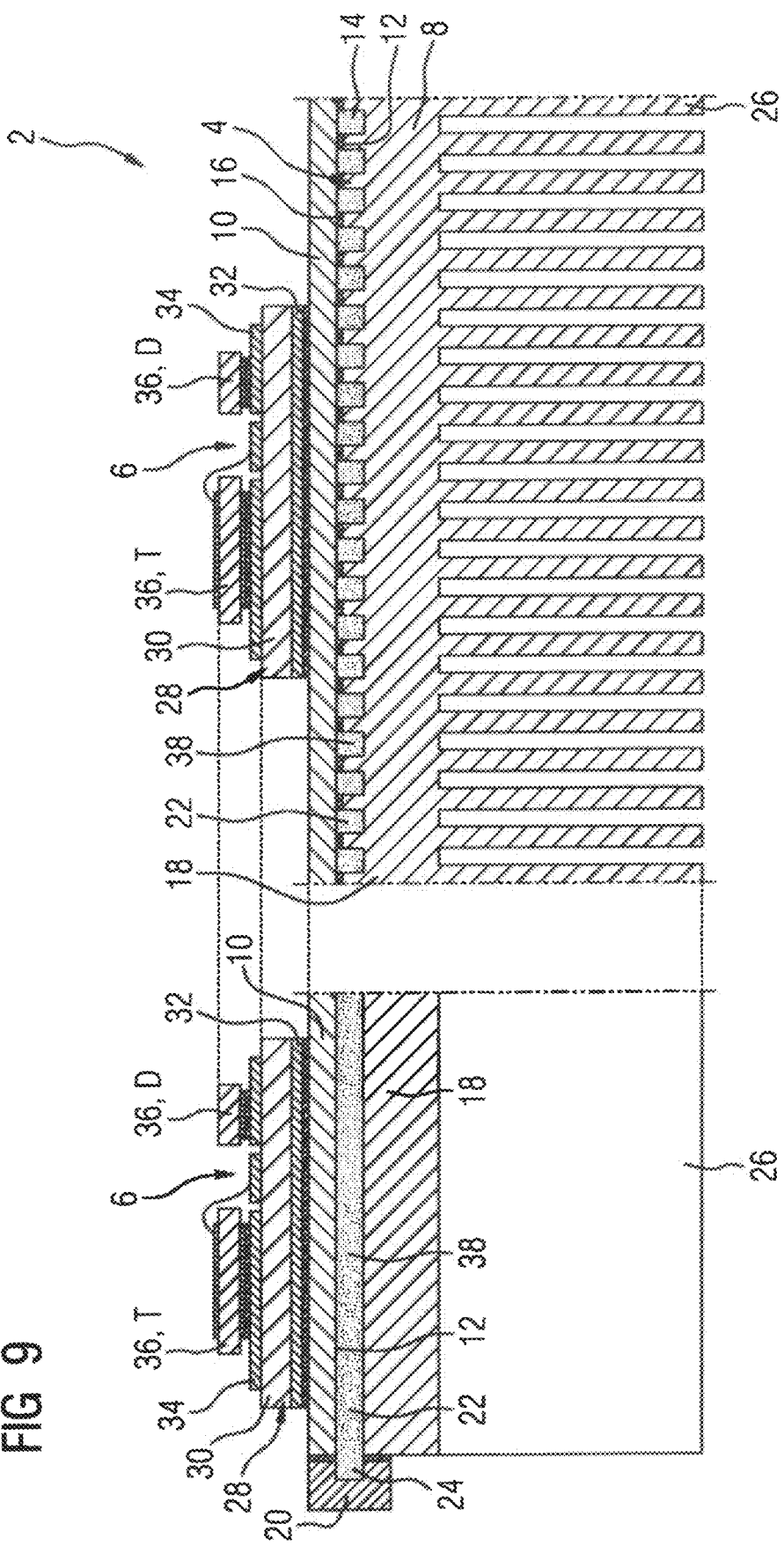
FIG. 9 shows a diagrammatic view of a seventh embodiment of a semiconductor module assembly in cross-section.

FIG. 9 shows a diagrammatic view of a seventh embodiment of a semiconductor module assembly 2 in cross-section. The cooling body main body 8 has a cooling body main body surface 16 which comprises a channel structure 14 in which a heat-transporting fluid 38, for example, water, acetone or methanol, is located. The channel structure 14 is hermetically sealed by means of an integral connection of the cooling body main body 8 to a first surface 12 of the cooling body attachment 10, so that both the cooling body attachment 10 and the cooling body main body 8 are in direct contact with the heat-transporting fluid 38, and the hermetically sealed channel structure 14 and the heat-transporting fluid 38 form a pulsating heat pipe which is thermally conductively connected to the semiconductor module 6.

The cooling body main body 8 has a central piece 18 and end pieces 20 arranged on both sides, wherein the central piece 18 comprises essentially parallel channels 22 of the channel structure 14, and wherein the end pieces arranged on both sides 20 each have deflection channels 24 of the channel structure 14, wherein the deflection channels 24 are arranged in such a way that the essentially parallel channels 22 of the central piece 18 are in fluidic connection. The cooling body main body 8 has a plurality of cooling fins 26 on a side facing away from the cooling body attachment 10, the essentially parallel channels 22 of the central piece 18 being arranged running parallel to the cooling fins 26. The cooling body main body 8, which is made of aluminum or an aluminum alloy, for example, can thus be molded easily by means of extrusion. The further embodiment of the semiconductor module assembly 2 in FIG. 9 corresponds to that in FIG. 2.

FIG. 10 shows a diagrammatic view of an eighth embodiment of a semiconductor module assembly 2 in cross-section, the cooling body attachment 10 having a continuous cavity 44 on a second surface 42, in which cavity the semiconductor module 6 is contacted with the cooling body main body 8. In particular, the metallization 32 of the substrate 28 is integrally connected to the cooling body main body 8, so that the semiconductor module 6 is in direct contact with the heat-transporting fluid 38. The further embodiment of the semiconductor module assembly 2 in FIG. 10 corresponds to that in FIG. 9.

FIG. 11 shows a diagrammatic view of a power converter 46 with a semiconductor module assembly 2. The power converter 46 may comprise more than one semiconductor module assembly 2.

In summary, the invention relates to a semiconductor module assembly 2 having a cooling body 4 and at least one semiconductor module 6 which is contacted on the cooling body 4. To allow more effective heat dissipation and more cost-effective production in comparison with the prior art, according to the invention the cooling body 4 comprises a cooling body main body 8 and a cooling body attachment 10, wherein the cooling body attachment 10 has, on a first surface 12, a channel structure 14 in which a heat-transporting fluid 38 is located, wherein the cooling body main body 8 has a cooling body main body surface 16, wherein the channel structure 14 is hermetically sealed by an integral connection with the cooling body main body surface 16 of the cooling body main body 8 so that both the cooling body attachment 10 and the cooling body main body 8 are hi direct contact with the heat-transporting fluid 38, wherein the hermetically sealed channel structure 14 and the heat-transporting fluid 38 form a pulsating heat pipe which is thermally conductively connected to the semiconductor module 6.

The invention claimed is:

1. A semiconductor module assembly, comprising:
a cooling body comprising a cooling body main body which has a cooling body main body surface, and a cooling body attachment which has a first surface formed thereon with a channel structure in which a heat-transporting fluid is located and which is hermetically sealed by an integral connection with the cooling body main body surface of the cooling body main body so that both the cooling body attachment and the cooling body main body are in direct contact with the heat-transporting fluid, said cooling body attachment comprising a central piece which comprises essentially parallel channels of the channel structure, and end pieces which are arranged on opposite sides of the central piece, respectively, each of the end pieces comprising deflection channels of the channel structure, with the deflection channels being arranged such as to establish a fluidic connection between the essentially parallel channels of the central piece; and
a semiconductor module designed for contact on the cooling body, with the hermetically sealed channel structure of the cooling body attachment and the heat-transporting fluid forming a pulsating heat pipe which is thermally conductively connected to the semiconductor module.

2. The semiconductor module assembly of claim 1, wherein the cooling body main body comprises a plurality of cooling fins on a side facing away from the cooling body attachment, said essentially parallel channels of the central piece designed to run transversely to the cooling fins.

3. The semiconductor module assembly of claim 1, wherein the semiconductor module comprises a substrate which comprises comprises a substrate on which a semiconductor element is disposed, the substrate comprising a metallization arranged on a side facing away from the semiconductor element, said metallization of the substrate being directly connected to the cooling body attachment.

4. The semiconductor module assembly of claim 1, wherein the cooling body attachment has a second surface formed with a cavity in which the semiconductor module is contacted with the cooling body attachment.

5. The semiconductor module assembly of claim 4, wherein the cavity is designed in such a way that the semiconductor module is in direct contact with the heat-transporting fluid.

6. The semiconductor module assembly of claim 1, wherein at least the central piece of the cooling body attachment is made from a metallic material, in particular from aluminum or an aluminum alloy.

7. The semiconductor module assembly of claim 6, wherein the central piece of the cooling body attachment is produced by extrusion.

8. The semiconductor module assembly of claim 1, wherein the cooling body attachment is made of a dielectric material which is coated, in particular completely, with a metallic material, said semiconductor module being connected to the cooling body attachment by soldering.

9. The semiconductor module assembly of claim 1, wherein the cooling body attachment is made of a dielectric material, said semiconductor module being connected to the cooling body attachment by adhesive bonding.

10. The semiconductor module assembly of claim 8, wherein the semiconductor module comprises a substrate which comprises comprises a substrate on which a semiconductor element is disposed, the substrate comprising a metallization arranged on a side facing away from the semiconductor element, with the semiconductor element of the semiconductor module being contacted directly on the metallization, said metallization being adhesively bonded directly to the cooling body attachment, with the dielectric material of the cooling body attachment being designed to be electrically insulating.

11. The semiconductor module assembly of claim 1, wherein the cooling body main body comprises a plurality of cooling fins on a side facing away from the cooling body attachment, said essentially parallel channels of the central piece designed to run parallel to the cooling fins.

12. A semiconductor module assembly, comprising:
a cooling body comprising a cooling body main body which has a cooling body main body surface formed thereon with a channel structure in which a heat-transporting fluid is located, and a cooling body attachment having a first surface to which the channel structure is hermetically sealed by an integral connection, so that both the cooling body attachment and the cooling body main body are in direct contact with the heat-transporting fluid, said cooling body main body comprising a central piece which comprises essentially parallel channels of the channel structure, and end pieces which are arranged on opposite sides of the central piece, respectively, each of the end pieces comprising deflection channels of the channel structure, with the deflection channels being arranged such that the essentially parallel channels of the central piece are in fluidic connection; and a semiconductor module designed for contact on the cooling body, with the hermetically sealed channel structure and the heat-transporting fluid forming a pulsating heat pipe which is thermally conductively connected to the semiconductor module.

13. The semiconductor module assembly of claim 12, wherein the semiconductor module comprises a substrate which comprises comprises a substrate on which a semiconductor element is disposed, the substrate comprising a metallization on a side facing away from the semiconductor element, said metallization of the substrate being directly connected to the cooling body.

14. The semiconductor module assembly of claim 12, wherein the cooling body attachment has a second surface formed thereon with a continuous cavity in which the semiconductor module is contacted with the cooling body main body, so that the semiconductor module is in direct contact with the heat-transporting fluid.

15. The semiconductor module assembly of claim 12, wherein at least the central piece of the cooling body main body is made of a metallic material, in particular of aluminum or an aluminum alloy.

16. The semiconductor module assembly of claim 15, wherein the central piece of the cooling body main body is produced by extrusion.

17. The semiconductor module assembly of claim 12, wherein the cooling body main body comprises a plurality of cooling fins on a side facing away from the cooling body attachment, said essentially parallel channels of the central piece designed to run parallel to the cooling fins.

18. A power converter, comprising a semiconductor module assembly, said semiconductor module assembly comprising:

a cooling body comprising a cooling body main body which has a cooling body main body surface, and a cooling body attachment which has a first surface formed thereon with a channel structure in which a heat-transporting fluid is located and which is hermetically sealed by an integral connection with the cooling body main body surface of the cooling body main body so that both the cooling body attachment and the cooling body main body are in direct contact with the heat-transporting fluid, said cooling body attachment comprising a central piece which comprises essentially parallel channels of the channel structure, and end pieces which are arranged on opposite sides of the central piece, respectively, each of the end pieces comprising deflection channels of the channel structure, with the deflection channels being arranged such as to establish a fluidic connection between the essentially parallel channels of the central piece; and a semiconductor module designed for contact on the cooling body, with the hermetically sealed channel structure of the cooling body attachment and the heat-transporting fluid forming a pulsating heat pipe which is thermally conductively connected to the semiconductor module.

19. A power converter, comprising a semiconductor module assembly, said semiconductor module assembly comprising:

a cooling body comprising a cooling body main body which has a cooling body main body surface formed thereon with a channel structure in which a heat-transporting fluid is located, and a cooling body attachment having a first surface to which the channel structure is hermetically sealed by an integral connection, so that both the cooling body attachment and the cooling body main body are in direct contact with the heat-transporting fluid, said cooling body main body comprising a central piece which comprises essentially parallel channels of the channel structure, and end pieces which are arranged on opposite sides of the central piece, respectively, each of the end pieces comprising deflection channels of the channel structure, with the deflection channels being arranged such that the essentially parallel channels of the central piece are in fluidic connection; and a semiconductor module designed for contact on the cooling body, with the hermetically sealed channel structure and the heat-transporting fluid forming a pulsating heat pipe which is thermally conductively connected to the semiconductor module.

* * * * *